United States Patent [19]
Nakayoshi et al.

[11] Patent Number: 5,863,829
[45] Date of Patent: Jan. 26, 1999

[54] PROCESS FOR FABRICATING SOI SUBSTRATE

[75] Inventors: Yuichi Nakayoshi, Kitamorokata; Hiroaki Yamamoto, Miyazaki; Akihiro Ishii, Kobayashi, all of Japan

[73] Assignee: Komatsu Electronic Metals Co., Ltd., Hiratsuka, Japan

[21] Appl. No.: 748,406

[22] Filed: Nov. 13, 1996

[51] Int. Cl.⁶ .................................................. H01L 21/302
[52] U.S. Cl. .......................... 438/459; 216/20; 216/36; 216/53; 216/57; 216/79; 438/690; 438/704; 438/734; 438/977
[58] Field of Search ..................... 438/459, 690, 438/704, 734, 977, 409; 216/36, 20, 53, 57, 79; 148/DIG. 12

[56] References Cited

U.S. PATENT DOCUMENTS

| | | | |
|---|---|---|---|
| 5,032,544 | 7/1991 | Ito et al. | 437/228 |
| 5,233,218 | 8/1993 | Miura | 257/618 |
| 5,258,323 | 11/1993 | Sarma et al. | 437/63 |
| 5,494,849 | 2/1996 | Iyer et al. | 437/63 |
| 5,668,045 | 9/1997 | Golland et al. | 438/459 |

FOREIGN PATENT DOCUMENTS

| | | |
|---|---|---|
| 5-90545 A2 | 4/1993 | Japan . |
| 7-211876 A | 8/1995 | Japan . |
| 8-274286 A | 10/1996 | Japan . |

*Primary Examiner*—R. Bruce Breneman
*Assistant Examiner*—Anita Alanko
*Attorney, Agent, or Firm*—Varndell Legal Group

[57] ABSTRACT

The present invention provides a process for fabricating an SOI substrate with no peripheral scratches and with enhanced fabrication efficiency. The present process includes bonding a semiconductor wafer of an active substrate 1 and a semiconductor base wafer 2 to form a bonded wafer 4; surface-grinding the active substrate 1; spin etching the surface-ground active substrate 1; and PACE processing the etched active substrate 1 to form the active substrate into a thin film and simultaneously, to remove the non-bonded peripheral portion of the bonded wafer 4.

4 Claims, 2 Drawing Sheets

PROCESS FOR FABRICATING SOI SUBSTRATE

BACKGROUND OF THE INVENTION

1. Field of the Invention

The present invention relates to a process for fabricating an SOI substrate-by subjecting a bonded wafer composed of a semiconductor wafer of an active substrate bonded on by a semiconductor wafer of a supporting substrate to PACE (plasma assisted chemical etching) process to form the active substrate into a thin film.

2. Description of the Prior Art

The demand for SOI substrates has continuously increased in recent years, in order to make integrated circuits operatable at higher speeds. Particularly, SOI substrates including active substrates which are thin films have been commonly used to make integrated circuits operate at even further higher speeds. A conventional SOI substrate including an active substrate which is a thin film is fabricated by the following steps:

(1) bonding a semiconductor wafer of an active substrate 11 and a semiconductor wafer of a supporting substrate 12 to form a bonded wafer 14 (referring to FIG. 2a);

(2) L-shaped-grinding the peripheral edge of the active substrate 11 of the bonded wafer 14 (referring to FIG. 2b);

(3) alkaline etching the L-shaped-grinded bonded wafer 14 to remove the surrounding oxide film 13 and the non-attached portion of the peripheral edge (referring to FIG. 2c);

(4) surface grinding the alkaline etched. active substrate 11 of the bonded wafer 14 to reduce the thickness of the active substrate (referring to FIG. 2d);

(5) polishing the surface ground active substrate 11 to further reduce its thickness (referring to FIG. 2e); and (6) PACE processing the polished active substrate 11 to form the active substrate into a thin film (referring to FIG. 2f).

However, the above-mentioned process suffers from the disadvantage that it is difficult to control the etching rate, and at a peripheral edge of the substrate scratches are formed easily.

In addition, the lead time required for L-grinding and alkaline etching is too long, thus the output of the fabrication quantity is limited, resulting in unsatisfactory efficiency.

SUMMARY OF THE INVENTION

An object of the present invention is to solve the above-mentioned problems and provide a process for fabricating an SOI substrate with no peripheral scratches and with enhanced fabrication efficiency.

According to the present invention, the process for fabricating the SOI substrate of the present invention comprises subjecting a bonded wafer, in which the bonded wafer consists of a semiconductor wafer of an active substrate bonded on by a semiconductor wafer of a supporting substrate, to PACE (plasma assisted chemical etching) process to form the active substrate into a thin film so as to obtain the SOI substrate, characterized in that a non-bonded peripheral portion of the bonded wafer is removed by the PACE process.

Furthermore, the process for fabricating the SOI substrate comprises bonding a semiconductor wafer of an active substrate and a semiconductor wafer of a supporting substrate to form a bonded wafer; surface-grinding the active substrate; spin etching the active substrate; and finally PACE processing the etched active substrate to form the etched active substrate into a thin film and simultaneouly to remove the non-bonded peripheral portion of the bonded wafer.

DETAILED DESCRIPTION OF THE INVENTION

The process for fabricating the SOI substrate of the present invention will be explained by the following examples accompanied by the drawings.

The process for fabricating the SOI substrate of the present invention can be described as follows.

Figure 1A:
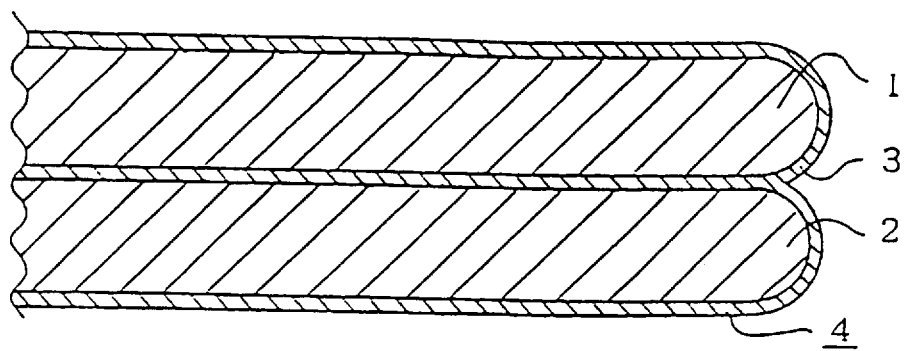
FIGS. 1a through 1d show steps of a process for fabricating an SOI substrate in accordance with the present invention.

(1) Referring to FIG. 1a, just as with the conventional process, a semiconductor wafer of an active substrate 1 and a semiconductor wafer of a supporting substrate 2 are bonded together to form a bonded wafer 4 surrounded with oxide films 3.

Figure 1B:
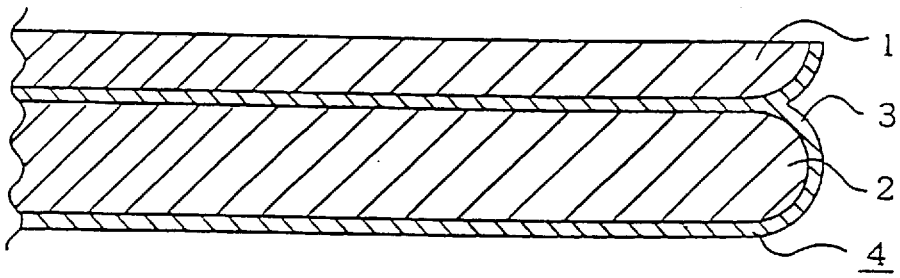

(2) Referring to FIG. 1b, the active substrate 1 is subjected to surface-grinding to reduce its thickness to 15 $\mu$m.

Figure 1C:
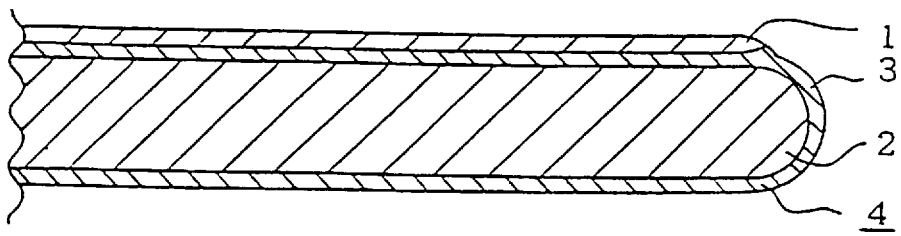

(3) Referring to FIG. 1c, the active substrate 1 is then subjected to spin etching to reduce its thickness to 3 $\mu$m.

Figure 1D:
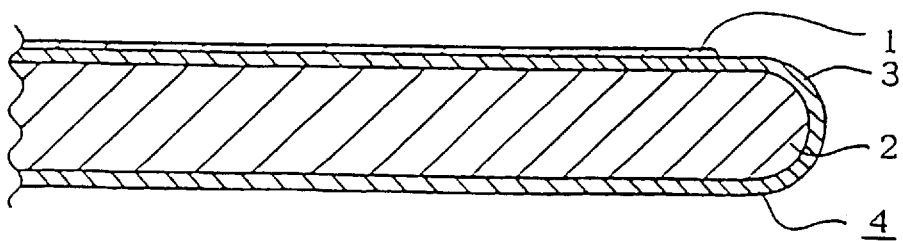
Figure 2A:
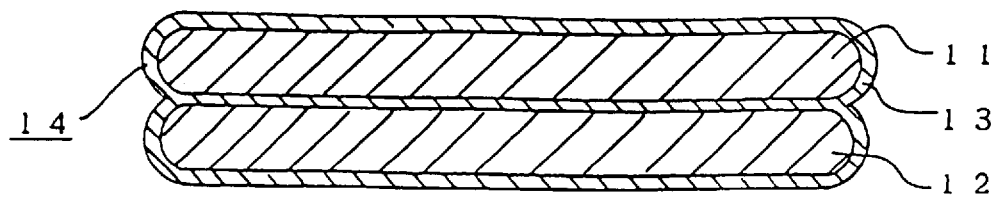
FIGS. 2a through 2f show steps of a process for fabricating an SOI substrate in accordance with the conventional technique.
Figure 2B:
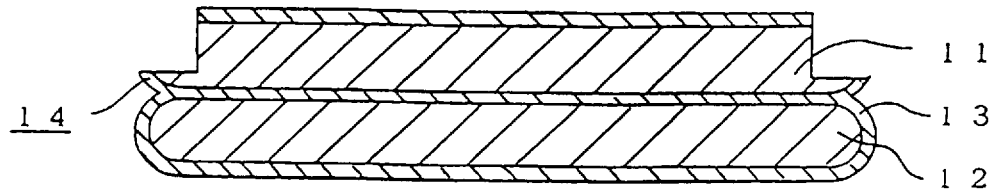
Figure 2C:
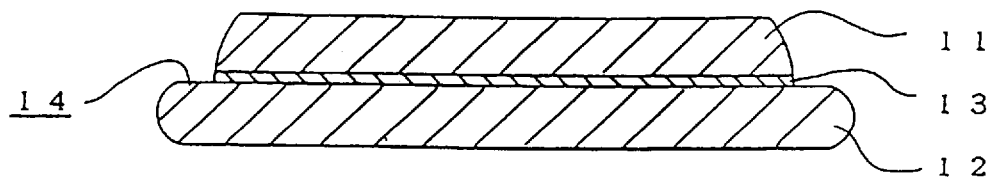
Figure 2D:
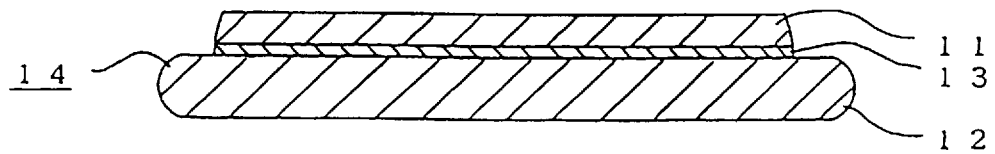
Figure 2E:
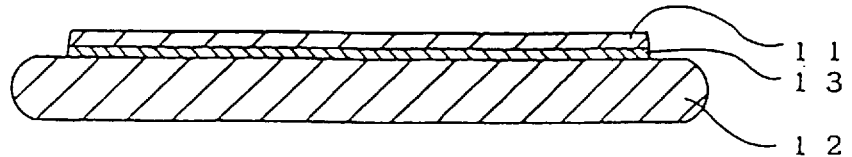
Figure 2F:
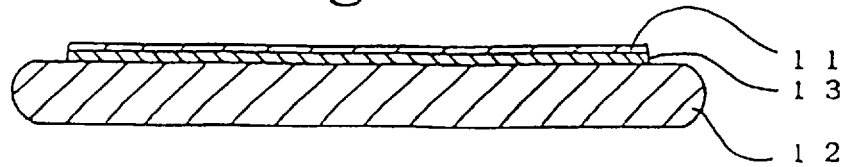

(4) Referring to FIG. 1d, the active substrate 1 is thin film formed by PACE processing to reduce its thickness to 0.1–0.2 $\mu$m. At that time, the program of the PACE processing is set such as to remove the peripheral portion of the active substrate 1, therefore, at the same time as the thin film forming, the non-bonded peripheral portion of the bonded wafer 4 can be removed.

In order to prevent uneven processing and to control the etching rate, the etching solution used in the spin etching is preferably a mixed acid, for example, a mixed solution of hydrofluoric acid, nitric acid, n-phosphoric acid($H_3PO_4$) and sulfuric acid.

According to the fabricating process of the present invention, since the L-shaped grinding and alkaline etching steps in the conventional process are omitted, therefore, the fabrication time is extensively shortened. Moreover, comparing the spin etching of the present invention with the conventional polishing, the lead time is shortened, thus the fabrication efficiency is further increased.

EXAMPLE

An example of the present invention is explained as follows.

Table 1 shows the differences in fabrication efficiency between the process of the present invention and that of the conventional process.

TABLE 1

The processing time for fabricating 1000 SOI substrates

| Processing steps | Fabricating process Processing time (hours) | |
| --- | --- | --- |
| | Conventional technique | Present invention |
| L-grinding | 128 | — |
| Alkaline etching | 70 | — |
| Plane grinding | 50 | 50 |
| Polishing | 250 | — |
| Spin etching | — | 42 |
| PACE processing | 84 | 117 |
| Total | 582 | 209 |

As can be seen clearly in Table 1, according to the conventional process, it takes about 582 hours to fabricate 1000 SOI substrates, while according to the present invention, it takes only about one third of the conventional time (i.e., 209 hours) to fabricate the same quantity of SOI substrates. Therefore, the fabrication efficiency is considerably enhanced by employing the present invention.

Since the present invention saves some of the processing steps of the conventional process, the fabrication efficiency is considerably enhanced.

Moreover, since the non-bonded peripheral portion of the bonded wafer is removed by PACE processing, therefore, the present invention has the additional advantage of greatly reducing the scratch which is easily formed on the peripheral portion.

What is claimed is:

1. A process for fabricating an SOI substrate, comprising subjecting a bonded wafer, in which the bonded wafer is composed of a semiconductor wafer of an active substrate bonded on by a semiconductor base wafer, to PACE (plasma assisted chemical etching) process to form the active substrate into a thin film so as to obtain the SOI substrate, characterized in that a non-bonded peripheral portion of the bonded wafer is simultaneously removed by the PACE process.

2. A process for fabricating an SOI substrate, characterized in that the process comprises the following steps of:

(1) bonding a semiconductor wafer of an active substrate and a semiconductor base wafer to form a bonded wafer;

(2) surface-grinding the active substrate of the bonded wafer;

(3) etching the surface-ground active substrate by spin etching; and (4) PACE processing the etched active substrate to form the etched active substrate into a thin film and simultaneously to remove a non-bonded peripheral portion of the bonded wafer.

3. The process for fabricating an SOI substrate as. claimed in claim 2, wherein an etching solution used in the spin etching is a mixed acid.

4. The process for fabricating an SOI substrate as claimed in claim 3, wherein the mixed acid comprises hydrofluoric acid, nitric acid, n-phosphoric acid and sulfuric acid.

* * * * *